(12) United States Patent
Fichera

(10) Patent No.: US 7,460,349 B2
(45) Date of Patent: Dec. 2, 2008

(54) PROTECTION OF A POWER TRANSISTOR

(75) Inventor: Pietro Fichera, Luynes (FR)

(73) Assignee: STMicroelectronics S.A., Montrouge (FR)

( * ) Notice: Subject to any disclaimer, the term of this patent is extended or adjusted under 35 U.S.C. 154(b) by 162 days.

(21) Appl. No.: 11/262,489

(22) Filed: Oct. 27, 2005

(65) Prior Publication Data

US 2006/0250742 A1    Nov. 9, 2006

(30) Foreign Application Priority Data

Oct. 27, 2004   (FR) .................................. 04 52449

(51) Int. Cl.
*H02H 3/08* (2006.01)
*H02H 9/02* (2006.01)
*H02H 3/20* (2006.01)
*H02H 9/04* (2006.01)

(52) U.S. Cl. ................ 361/93.1; 361/93.7; 361/91.5

(58) Field of Classification Search ................ 361/93.1
See application file for complete search history.

(56) References Cited

U.S. PATENT DOCUMENTS 4,679,112 A  *  7/1987  Craig ........................... 361/33

5,272,392 A  * 12/1993  Wong et al. .................. 327/109
6,054,740 A      4/2000  Barret et al. ................. 257/355
6,078,204 A      6/2000  Cooper et al. ............... 327/309

FOREIGN PATENT DOCUMENTS

DE    4428675    2/1996
DE    19841227   3/2000

OTHER PUBLICATIONS

"Parallel output drivers for inductive load," *Research Disclosure*, 438(22), Kenneth Mason Publications, Hampshire, Great Britain, Oct. 2000.
"Mise en Parallele de Mosfet," *Electronique*, 36:86-87, CEP Communication, Paris, France, Mar. 1, 1994.

* cited by examiner

*Primary Examiner*—Stephen W Jackson
*Assistant Examiner*—Lucy Thomas
(74) *Attorney, Agent, or Firm*—Lisa K. Jorgenson; E. Russell Tarleton; Seed IP Law Group PLLC

(57) ABSTRACT

A method and a circuit for protecting a transistor that controls the supply of an at least partially inductive load, including lowering the demagnetization voltage of the inductive load with respect to a demagnetization voltage set by a break-over component connected between a conduction terminal and the control terminal of the transistor.

25 Claims, 2 Drawing Sheets

PROTECTION OF A POWER TRANSISTOR

BACKGROUND OF THE INVENTION

1. Field of the Invention

The present invention relates to the protection against overcurrents in transistors carrying a load supply current and, for example, to the protection of transistors connected in parallel to control an at least partially inductive load, and more specifically the forming of individual circuits for protecting these transistors on demagnetization of the inductive load.

2. Description of the Related Art

FIG. 1 shows a conventional example of an assembly of several MOS power transistors M (M1, ... Mn) connected in parallel between a terminal 1 of application of a supply voltage Vbat (for example, the voltage of a battery) and a terminal 2 of connection to a load Q to be powered, the other end of the load being for example connected to ground 3. In the example of FIG. 1, only two transistors M1 and Mn have been shown. In practice, the number n of parallel-connected transistors M depends on the power required by the load and on the current that each transistor can individually conduct.

All transistors M1 to Mn are controlled from a same signal CTRL that they respectively receive via logic and level-adapting blocks B1 to Bn (LOG) (for example, charge pump, set-up circuits, etc.) on their respective control terminals (gate) G (G1 to Gn). The respective conduction terminals (drain and source) of transistors M are directly connected to terminals 1 and 2.

Each transistor M is associated with a protection circuit formed of a zener diode DZ (DZ1, ... DZn) in anti-series with a respective diode D (D1, ... Dn) between terminal 1 and gate G of the concerned transistor.

When transistors M1 to Mn are controlled to be turned on by signal CTRL, load Q is supplied with voltage Vbat. Diodes DZ1 to DZn are reverse-biased. Diodes DZ have no function in the conduction phase since their threshold voltages are greater than the supply voltage, so that the voltage difference between control signal CTRL and voltage Vbat does not place them in avalanche when signal CTRL is active to turn on transistors M.

When transistors M1 to Mn are controlled to be turned on by a state switching of signal CTRL, a problem of current distribution is traditionally posed in power transistors. This problem is particularly present in the case of an at least partially inductive load due to the demagnetization phenomenon. This demagnetization results in the voltage at terminal 2 becoming lower than the voltage at terminal 3 (the ground), which considerably increases the voltage difference between terminals 1 and 2. To carry off the demagnetization current, transistors M1 and Mn must be turned on until this current disappears. This is the function of diodes DZ1 to DZn which set the demagnetization voltage, that is, the voltage across inductive load Q in the carrying off in the power supply of the demagnetization current. In fact, when the voltage of terminal 2 is lowered by the demagnetization to a value such that the voltage difference between terminals 1 and 2 exceeds the threshold voltage of diodes DZ, (neglecting gate-source voltage Vgs of transistors M and voltage drop VD in each forward-biased diode D), these diodes start an avalanche and impose a positive voltage between the gate and source of the corresponding transistors M to turn them on.

When control signal CTRL is inactive, demagnetization voltage Vdemag (the voltage across load Q) can be written, for each transistor M, as:

$$V\text{demag} = V\text{bat} - (VDZ + VD + Vgs),$$

where VDZ represents the threshold voltage of zener diode DZ.

Forward voltage drops VD of diodes D are all fixed (on the order of 0.6 V), just as voltages Vgs of the different MOS transistors are approximately fixed, as well as battery voltage Vbat. Accordingly, in the above relation, it can be seen that the single parameter which conditions demagnetization voltage Vdemag of the load is the threshold voltage of zener diodes DZ.

Zener diodes DZ1 to DZn are thus all selected to have the same nominal values, to set the same demagnetization voltage, for the entire assembly, and distribute the current in all branches.

A disadvantage of the circuit of FIG. 1 is that manufacturing tolerances and technological dispersions make the respective threshold voltages of the different zener diodes DZ1 to DZn of the protection circuits of transistors M1 to Mn vary from one branch to another. This problem is particularly present in the case where each power transistor M is integrated with its protection circuit and its logic block in a circuit separate from the other transistors which are then associated in parallel in an assembly such as shown in FIG. 1. The presence of blocks B prevents a direct interconnection of all the gates of transistors M, which imposes providing one protection circuit (diodes DZ and D) per branch.

In fact, the zener diode DZ which has the smallest threshold voltage conducts first and thus imposes on its transistor a positive voltage Vgs to turn it on to carry off the demagnetization current. Since the other transistors M are not on yet because the protection zener diodes DZ associated therewith have greater thresholds, all the current flows through a single transistor M and said transistor is thus damaged since it is not designed to stand all of the current.

BRIEF SUMMARY OF THE INVENTION

The disclosed embodiments of the present invention maintain the balance between currents in the difference branches of a parallel association of several transistors in a demagnetization of an inductive load despite possible technological challenges and manufacturing tolerances of zener protection diodes.

In one embodiment of the present invention a circuit for protecting a transistor is provided. The circuit includes at least one break-over component in anti-series with a one-way conduction element coupled between a first conduction terminal and a control terminal.

These include a resistive element in series with the break-over component; and a controllable current source between a terminal of the one-way conduction element opposite to said transistor and a second conduction terminal of the transistor.

According to an embodiment of the present invention, the current source is controlled according to the current in the transistor.

According to an embodiment of the present invention, the second conduction terminal of the transistor is intended to be connected to an at least partially inductive load, the current source belonging to a circuit for decreasing a demagnetization voltage set by the break-over component.

According to an embodiment of the present invention, the demagnetization voltage is lowered if the current in the transistor becomes greater than a threshold.

According to an embodiment of the present invention, the break-over component is a zener diode.

According to an embodiment of the present invention, the transistor is a MOS transistor.

The disclosed embodiments of the present invention also provide a circuit for supplying a load with several transistors coupled in parallel and connected between a first terminal of application of a supply voltage and a first terminal of the load, each transistor associated with a protection circuit.

According to an embodiment of the present invention, the load is at least partially inductive.

The present invention also provides a method for protecting a control transistor to supply an at least partially inductive load, the method including the step of lowering the demagnetization voltage of the load with respect to a demagnetization voltage set by a break-over component connected between a conduction terminal and the control terminal of the transistor.

In accordance with another embodiment of the invention, a circuit is provided that includes first and second parallel-coupled transistors, each transistor having a first terminal coupled to a supply terminal, a second terminal coupled to a load terminal, and a control terminal to receive a control signal; and a protection circuit, the protection circuit including a first diode coupled in series to a second diode between the first terminal of each transistor and the control terminal of each transistor, a first resistive element coupled in series with the first and second diodes, and a current source coupled between a first terminal of the resistive element and the load terminal.

In accordance with another aspect of the foregoing embodiment, the first diode comprises a zener diode with a cathode coupled to the supply terminal and the second diode has a cathode coupled to the control terminal of the respective transistor. Ideally, the first resistive element is coupled between the first and second diodes with the first terminal of the resistive element also coupled to an anode of the second diode.

In accordance with another aspect of the foregoing embodiment, a control circuit is coupled to the second terminal of each transistor and to a control terminal of the current source.

In accordance with another embodiment of the invention, a circuit is provided that includes a power transistor having a first terminal coupled to a supply terminal and a second terminal coupled to a load terminal, and a control terminal configured to receive a control signal; and a protection circuit that includes an auxiliary transistor having a first terminal coupled to the supply terminal and a second terminal coupled to the control terminal of the power transistor; a first diode having a cathode coupled to the supply terminal and an anode coupled to the first terminal of the auxiliary transistor; a second diode having an anode coupled to a control terminal of the auxiliary transistor and a cathode coupled to the anode of the first diode; a first resistor coupled to the anode of the first diode and to the control terminal of the auxiliary transistor; and a current source coupled between the control terminal of the auxiliary transistor and the load terminal, the current source including a line coupling a second terminal of the current source to an auxiliary terminal of the power transistor.

In accordance with another aspect of the foregoing embodiment, the current source includes a first transistor having a first terminal coupled to a control terminal of the auxiliary transistor, a second terminal coupled to the load terminal, and a control terminal, and further including a second transistor having a first terminal coupled to a current supply, a second terminal coupled to the load terminal, and a control terminal coupled to the control terminal of the first transistor in the current source, the second terminal of the second transistor including the third terminal of the current source that is coupled to the auxiliary terminal of the power transistor.

In accordance with yet a further aspect of the foregoing embodiment, the circuit includes a resistive element coupled between the second terminal of the second transistor and the load terminal.

In accordance with a further aspect of the foregoing embodiment, a threshold voltage of the second diode is smaller than a threshold voltage of the first diode.

In accordance with yet another embodiment of the invention, a protection circuit is provided for a power transistor having a first conduction terminal, a second conduction terminal, and a control terminal configured to receive a control signal and at least one other transistor coupled in parallel to the power transistor, the at least one other transistor having a first terminal coupled to the first conduction terminal and a second terminal coupled to the second conduction terminal and a control terminal. The protection circuit includes means for sensing current in each of the power transistor and the at least one other transistor; and means for diverting current from one of the power transistor and the at least one other transistor that is conducting a maximum current, the diverting means responsive to the sensing means, and the diverting means further configured to cause the other of the power transistor and the at least one other transistor to conduct current in response to the sensing means.

In accordance with another aspect of the foregoing embodiment, the sensing means includes a breakover component coupled between the first conduction terminal and the control terminal of the respective power transistor and the at least one other transistor, a one-way conduction element coupled between the breakover element and a control terminal of the power transistor and the respective at least one other transistor, and at least one resistive element coupled between the breakover component and the one-way conduction element.

In accordance with yet another aspect of the foregoing embodiment, the diverting means includes a current source having a first terminal coupled to a node formed by the coupling of the first resistive element and the one-way conduction element and a second terminal coupled to the second conduction terminal of the respective power transistor and the at least one other transistor, and a control circuit coupled to a control terminal of the current source and to the second conduction terminal of the respective power transistor and the at least one other transistor.

BRIEF DESCRIPTION OF THE SEVERAL VIEWS OF THE DRAWINGS

The foregoing and other features and advantages of the present invention will be discussed in detail in the following non-limiting description of specific embodiments in connection with the accompanying drawings, wherein.

DETAILED DESCRIPTION OF THE INVENTION

Figure 1:
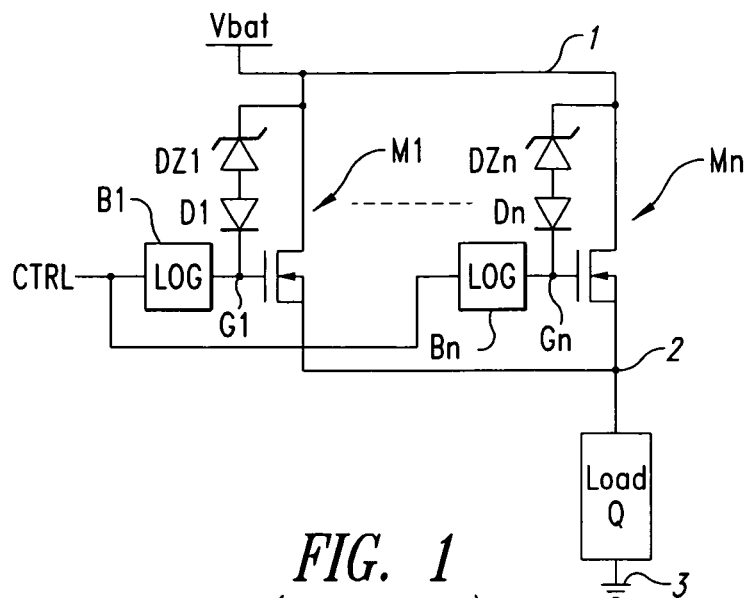
FIG. 1, previously described, is intended to show the state of the art.

In the figures, the same elements have been designated with same reference numerals in the different drawings. For clarity, only those elements that are necessary to the understanding of the present invention have been shown and will be described hereafter. In particular, the structure of the load supplied by several parallel power transistors has not been shown, the present invention being compatible with the load conventionally controlled by transistors in parallel. Further, the generation of the control signals of these power transistors has not been shown and is compatible with conventional systems.

The disclosed features of the present invention will be described hereafter in relation with an example applied to MOS power transistors. It should however be noted that the implementation more generally applies whatever the nature of the transistor, for example, a bipolar transistor.

Figure 2:
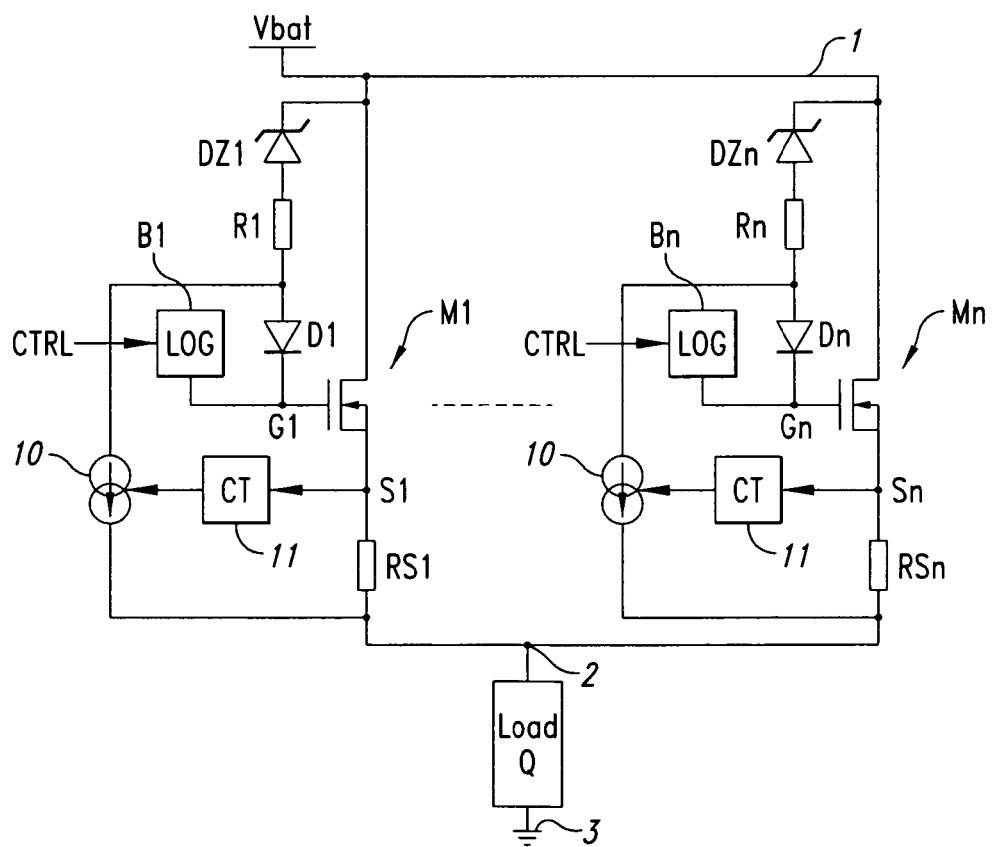
FIG. 2 schematically shows in the form of blocks an embodiment of circuits for protecting power transistors according to the present invention.

FIG. 2 schematically (and partially in the form of blocks) shows an embodiment of MOS power transistor protection circuits according to one embodiment of the present invention.

As previously described, several (n) MOS power transistors M1 to Mn are connected in parallel between a terminal 1 of application of a supply voltage Vbat (for example, the D.C. voltage of a battery) and a terminal 2 intended to be connected to a first conduction terminal of a load Q having its other terminal connected, for example, to ground 3.

According to the shown embodiment, the control electrode (gate) of each transistor M is connected to terminal 1 by a series association of a zener diode DZ (DZ1 to DZn), of a resistor R (R1 to Rn), and of a diode D (D1 to Dn). The cathode of each diode DZ is directly connected to terminal 1 while the cathode of each diode D is directly connected to gate G (G1 to Gn) of the transistor M with which it is associated. Each gate G receives a control signal CTRL via a conventional block B (B1 to Bn). As an alternative, resistor R is interposed between the cathode of diode DZ and terminal 1.

The resistor R is interposed between the respective anodes of diode DZ and of diode D. The function of resistor R is to effectively increase the threshold voltage of zener diode DZ to lower the source voltage of transistor M and thus the demagnetization voltage of the load.

The anode of diode D is further connected to terminal 2 by a controllable current source 10. The source 10 of each stage is individually controlled by a circuit 11 associated with the concerned stage which, in the shown example, measures the current in the main branch (in the involved transistor M) by means of a resistor RS (RS1 to RSn) connecting source S (S1 to Sn) of each transistor to terminal 2.

As in conventional embodiments, the different zener diodes used are provided to have a same nominal threshold voltage but may have different real threshold voltages from one diode to the other due to technological dispersions and/or manufacturing tolerances.

Here, however, when the first zener diode (that having the smallest real threshold voltage) starts an avalanche, and turns on the transistor M which is associated therewith, the current flow through this transistor starts the corresponding current source 10 via circuit 11. In practice, circuit 11 triggers current source 10 with respect to a threshold for example selected according to the maximum current that transistor M withstand. The higher the current in transistor M (measured by resistor RS), the higher the current in source 10.

The current diversion from the supply voltage to node 2 due to source 10 functionally decreases the level of the demagnetization voltage, that is, of the voltage of terminal 2. Now, by decreasing the voltage of terminal 2, the starting of the other branches having higher threshold voltages of their corresponding zener diodes is accelerated. Thus a single branch does not have to withstand the entire demagnetization current.

It can be seen that, in a first phase, the current in the transistor M that conducts first is maximum, that is, it absorbs the entire demagnetization current. During this phase, the current in zener diode DZ corresponds to the nominal current for which this diode is provided based on its threshold voltage. However, this first phase does not last. Due to the decrease in the voltage at node 2 by the action of the current diversion by source 10, the other branches turn on, which places all branches in a second phase where the current in the zener diode corresponds to the nominal value and where the current is distributed in transistors M in balanced fashion.

As an alternative, the temperature of transistors M may be measured, rather than the currents that they conduct.

Figure 3:
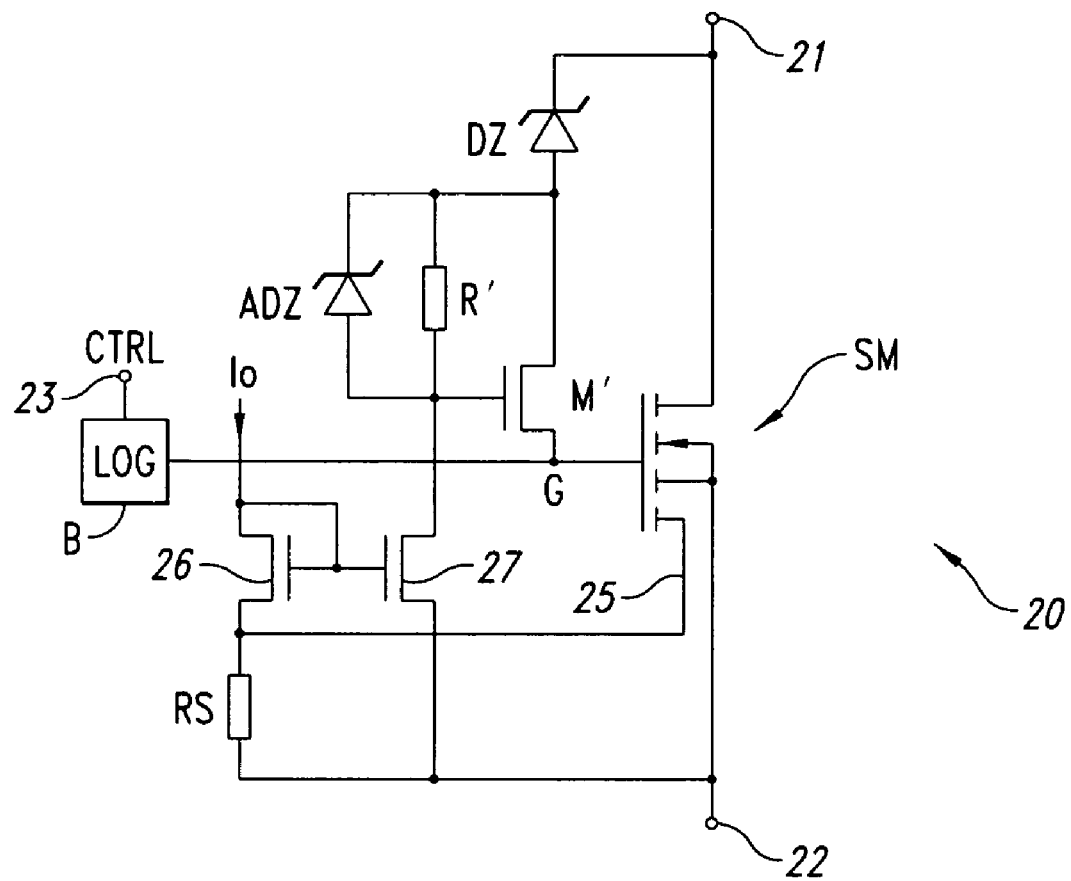
FIG. 3 shows a detailed embodiment of a power transistor and of its protection circuit according to the present invention.

FIG. 3 shows a detailed example of an integrated circuit 20 containing a power transistor (here, a MOS transistor SM) and a protection circuit according to an embodiment of the present invention. For example, integrated circuit 20 is a tripole having a control terminal 23 connected to the input of block B intended to receive control signal CTRL and having two conduction terminals 21 and 22 intended to be respectively connected to terminals 1 and 2 of an assembly in parallel associating several circuits 20.

In the example of FIG. 3, the function of diode D (FIG. 2) is ensured by an auxiliary transistor M' (for example, MOS) having a conduction terminal connected to the anode of diode DZ and having its other conduction terminal connected to gate G of transistor SM. Resistor R is in this example replaced with a resistor R' between the anode of diode DZ and the gate of transistor M' (and thus still in series with diode DZ) and is in parallel with an auxiliary zener diode ADZ which has the function of protecting transistor M'. The threshold voltage of diode ADZ is smaller than that of diode DZ. For example, for a diode DZ on the order of 30 volts, a diode ADZ on the order of a few volts will be sufficient.

In the embodiment of FIG. 3, to avoid the presence of the detection resistor in series with transistor M (FIG. 2), a current measurement transistor SM ("sense FET") having an auxiliary terminal 25 providing an image of the current flowing through said transistor SM will be used. Functionally, such a transistor amounts to connecting, between terminal 21 and the measurement input (terminal S) of a block 11 (FIG. 2), an additional transistor (symbolized by auxiliary terminal 25) having its gate connected to that of the main transistor.

Terminal 25 is connected to a first terminal of a measurement resistor RS having its other terminal connected to main terminal 22. The first terminal of resistor RS is further connected to a first transistor 26 (for example, MOS) of a current mirror having its other conduction terminal receiving a constant current 10. This current originates from a conventional external current source which needs not be detailed. Transistor 26 has its control terminal (its gate) connected to that of another transistor 27 (for example, MOS) and to its conduction terminal receiving current 10. The two conduction terminals of transistor 27 are respectively connected to the gate of transistor M' and to terminal 22. The function of the current mirror formed of transistor 26, 27 is to form a controllable current source adapting the current diverted by resistor R' from the current measured by resistor RS.

In the case where the assembly has more than two branches in parallel, once the first branch is conductive, it is not compulsory for the other branches to simultaneously start conducting. Their respective conduction times will depend on the thresholds of their respective zener diodes. However, as long as a detection circuit of one of the branches detects in the main transistor of this branch a current greater than its allowed threshold (set by its circuit 11, FIG. 2, or by the structure of its current mirror 26, 27, FIG. 3), it will attempt to lower the voltage of terminal 2 to start another branch.

An advantage of the present invention is that it compensates for the possible differences between the threshold voltages of the zener diodes of the protection circuits of the parallel-connected transistors.

Another advantage of the present invention is that the different circuits in parallel automatically adapt to the structures of the others. On this regard, it should be noted that each protection circuit associated with a power transistor is formed independently from the other branches. For example, the sizes of the transistors of the different branches may be different from one other, the respective starting thresholds of their protection circuits being then also different. However, the nominal threshold voltages of the zener diodes of the protection circuits are, preferably, selected to all have the same values.

Of course, the present invention is likely to have various alterations, modifications, and improvements which will readily occur to those skilled in the art. In particular, the dimensions to be given to the different components depend on the application and are within the abilities of those skilled in the art based on the functional indications given hereabove. Further, current sources other than those illustrated in FIG. 3 are possible, since other circuits may perform the function of lowering the level of the demagnetization voltage down to the point where the zener diodes of the other branches are triggered. Further, it should be reminded that although the present invention has been described in relation with an application to MOS transistors, it more generally applies whatever the type of transistors (especially bipolar), the adaptations of the voltage controls to turn them into a current control (bipolar case) being with the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A circuit for protecting a transistor coupled to a load, having a first conduction terminal and a control terminal, at least one break-over component in anti-series with a one-way conduction element, the protecting circuit comprising:
   a first resistive element in series with the break-over component; and
   a controllable current source connected to a terminal of the one-way conduction element opposite to the terminal coupled to said transistor and connected to a node between the second conduction terminal of the transistor and the load.

2. The circuit of claim 1 wherein said current source is controlled according to a current in said transistor.

3. The circuit of claim 1 wherein the second conduction terminal of the transistor is connected to a second resistive element that in turn is coupled to the load, said current source belonging to a circuit for decreasing a demagnetization voltage set by the break-over component.

4. The circuit of claim 1 wherein the demagnetization voltage is lowered when a current in the transistor becomes greater than a threshold.

5. The circuit of claim 1 wherein the break-over component is a zener diode.

6. The circuit of claim 1 wherein the transistor is a MOS transistor.

7. The circuit for supplying a load with several transistors in parallel connected between a first terminal of application of a supply voltage and a first terminal of the load, wherein each transistor is associated with the protection circuit of claim 1.

8. The circuit of claim 7 for supplying an at least partially inductive load.

9. A circuit, comprising:
   first and second parallel-coupled transistors, each transistor having a first terminal coupled to a supply terminal, a second terminal coupled to a load terminal, and a control terminal to receive a control signal; and
   a protection circuit comprising a first diode coupled in series to a second diode between the first terminal of each transistor and the control terminal of each transistor, a first resistive element coupled in series between the first and second diodes, and a current source coupled to a first terminal of the resistive element and to the load terminal, the current source controlled by a current in the second terminal of the respective transistor.

10. The circuit of claim 9 wherein the first diode comprises a zener diode with a cathode coupled to the supply terminal, and the second diode has a cathode coupled to the control terminal of the respective transistor.

11. The circuit of claim 10 wherein the first resistive element is coupled between the first and second diodes with the first terminal coupled to the anode of the second diode.

12. The circuit of claim 9, further comprising a control circuit coupled to a second terminal of each transistor and to a control terminal of the current source.

13. The circuit of claim 10 wherein the first diode is coupled in anti-series to the second diode such that the anode of each diode is coupled to the anode of the other diode.

14. A circuit, comprising:
   a power transistor having a first terminal coupled to a supply terminal and a second terminal coupled to a load terminal, and a control terminal configured to receive a control signal; and
   a protection circuit, comprising:
      an auxiliary transistor having a first terminal coupled to the supply terminal and a second terminal coupled to the control terminal of the power transistor;
      a first diode having a cathode coupled to the supply terminal and an anode coupled to the first terminal of the auxiliary transistor;
      a second diode having an anode coupled to a control terminal of the auxiliary transistor and a cathode coupled to the anode of the first diode;
      a first resistor coupled to the anode of the first diode and to the control terminal of the auxiliary transistor to be in parallel to the first diode; and
      a current source coupled to the control terminal of the auxiliary transistor and coupled to the load terminal, the current source including a line coupling a second terminal of the current source to an auxiliary terminal of the power transistor, the current source controlled by the current in the second terminal of the power transistor.

15. The circuit of claim 14 wherein the current source comprises a first transistor having a first terminal coupled to a control terminal of the auxiliary transistor, a second terminal coupled to the load terminal, and a control terminal, and further comprising a second transistor having a first terminal coupled to a current supply, a second terminal coupled to the load terminal, and a control terminal coupled to the control terminal of the first transistor in the current source, the second terminal of the second transistor comprising the third terminal of the current source that is coupled to the auxiliary terminal of the power transistor.

16. The circuit of claim 15, farther comprising a second resistor coupled between the second terminal of the second transistor and the load terminal.

17. The circuit of claim 14 wherein a threshold voltage of the second diode is smaller than a threshold voltage of the first diode.

18. A circuit for protecting a transistor having first and second conduction terminals and a control terminal, and a load coupled to the second conduction terminal, the circuit comprising:
   a break-over component
   a one-way conduction element coupled in series with the break-over component between the first conduction terminal and the control terminal of the transistor, the one-way conduction element having a first conduction terminal coupled to the control terminal and a second conduction terminal coupled to the break-over component;
   a resistive element coupled between the break-over component and the one-way conduction element; and
   a controllable current source connected to the second conduction terminal of the one-way conduction element and connected to the second conduction terminal of the transistor, the controllable current source controlled by a current in the second conduction terminal of the transistor.

19. The circuit of claim 18 wherein said current source is controlled according to a current in said transistor.

20. The circuit of claim 18 wherein the second conduction terminal of the transistor is connected to an at least partially inductive load, said current source belonging to a circuit for decreasing a demagnetization voltage set by the break-over component.

21. The circuit of claim 18 wherein the demagnetization voltage is lowered if a current in the transistor becomes greater than a threshold.

22. The circuit of claim 18 wherein the break-over component is a zener diode.

23. The circuit of claim 18 wherein said transistor is a MOS transistor.

24. A circuit for supplying a load, the circuit comprising:
   a plurality of transistor legs connected in parallel between a supply voltage terminal and a load terminal of the load, each transistor leg including a respective transistor having a first conduction terminal, a second conduction terminal that is coupled to the load terminal, and a control terminal; and
   a plurality of protection circuits corresponding to the transistors of the transistor legs, respectively, each protection circuit including:
      a break-over component
      a one-way conduction element coupled with the break-over component between the first conduction terminal and the control terminal of the transistor, the one-way conduction element having a first conduction terminal coupled to the gate and a second conduction terminal coupled to the break-over component;
      a resistive element connected between the break-over component and the one-way conduction element; and
      a controllable current source connected to the second conduction terminal of the one-way conduction element and connected to the second conduction terminal of the transistor, the controllable current source controlled by a current in the second conduction terminal of the transistor.

25. The circuit of claim 24 for supplying a load, comprising a control circuit coupled to the control terminal of the respective transistor and to the controllable current source.

* * * * *

UNITED STATES PATENT AND TRADEMARK OFFICE
CERTIFICATE OF CORRECTION

| | | |
|---|---|---|
| PATENT NO. | : 7,460,349 B2 | |
| APPLICATION NO. | : 11/262489 | |
| DATED | : December 2, 2008 | |
| INVENTOR(S) | : Pietro Fichera | |

It is certified that error appears in the above-identified patent and that said Letters Patent is hereby corrected as shown below:

Column 7
Line 59, "between the second conduction terminal of the transistor" should read as -- between a second conduction terminal of the transistor --

Column 8
Line 33, "first terminal coupled to the anode of the second diode" should read as -- first terminal coupled to an anode of the second diode --

Line 35, "circuit coupled to a second terminal of each transistor and to" should read as -- circuit coupled to the second terminal of each transistor and to --

Line 38, "coupled in anti-series to the second diode such that the anode" should read as -- coupled in anti-series to the second diode such that an anode --

Lines 66-67, "comprises a first transistor having a first terminal coupled to a control terminal of the auxiliary transistor," should read as -- comprises a first transistor having a first terminal coupled to the control terminal of the auxiliary transistor, --

Column 9
Line 6, "terminal of the second transistor comprising the third terminal" should read as -- terminal of the second transistor comprising a third terminal --

Line 9, "The circuit of claim 16, farther comprising a second" should read as -- The circuit of claim 16, further comprising a second --

UNITED STATES PATENT AND TRADEMARK OFFICE
CERTIFICATE OF CORRECTION

PATENT NO. : 7,460,349 B2
APPLICATION NO. : 11/262489
DATED : December 2, 2008
INVENTOR(S) : Pietro Fichera It is certified that error appears in the above-identified patent and that said Letters Patent is hereby corrected as shown below:

<u>Column 10</u>
Line 4, "The circuit of claim 22 wherein the demagnetization" should read as -- The circuit of claim 20 wherein the demagnetization --

Line 26, "coupled to the gate and a second conduction terminal" should read as -- coupled to a gate and a second conduction terminal --

Signed and Sealed this

Tenth Day of March, 2009

JOHN DOLL
*Acting Director of the United States Patent and Trademark Office*